United States Patent [19]

Rippere

[11] Patent Number: 4,518,661

[45] Date of Patent: May 21, 1985

[54] CONSOLIDATION OF WIRES BY CHEMICAL DEPOSITION AND PRODUCTS RESULTING THEREFROM

[76] Inventor: Ralph E. Rippere, 21420 N. 24th Dr., Phoenix, Ariz. 85027

[21] Appl. No.: 425,658

[22] Filed: Sep. 28, 1982

[51] Int. Cl.³ ............................................. B21F 27/08
[52] U.S. Cl. ...................................... 428/598; 428/613; 428/614; 428/929; 428/936; 427/443.1; 174/129 R; 204/24; 204/27; 228/178; 228/198
[58] Field of Search ............... 204/11, 16, 24, 27, 204/28; 427/443.1; 228/178, 198; 29/419; 174/129 R; 245/2; 429/42, 44; 428/608, 613, 614, 570, 598, 929, 931, 936, 935

[56] References Cited

U.S. PATENT DOCUMENTS

| | | | |
|---|---|---|---|
| 1,934,643 | 11/1933 | Rafton | 204/24 |
| 2,078,014 | 4/1937 | Oplinger et al. | 204/24 |
| 2,616,165 | 11/1952 | Brennan | 228/198 X |
| 2,640,789 | 6/1953 | Hauser | 204/24 |
| 2,978,389 | 4/1961 | Turnbull | 204/24 |
| 3,249,686 | 5/1966 | Paar | 174/117 |
| 3,378,629 | 4/1968 | Rask | 174/117 |
| 3,390,750 | 7/1968 | Albertson | 192/107 |
| 3,391,455 | 7/1968 | Hirohata et al. | 29/625 |
| 3,414,666 | 12/1968 | Doundoulakis et al. | 174/68.5 |
| 3,429,766 | 2/1969 | Stormfeltz | 161/35 |
| 3,474,297 | 10/1969 | Bylander | 317/101 |
| 3,482,300 | 12/1969 | Reinke | 228/178 X |
| 3,520,390 | 7/1970 | Bentz | 192/107 |
| 3,534,464 | 10/1970 | Lallemant | 29/471.3 |
| 3,600,258 | 8/1971 | Morton | 161/42 |
| 3,631,298 | 12/1971 | Davis | 174/68.5 |
| 3,632,485 | 1/1972 | Kerstetter | 204/16 |
| 3,649,865 | 3/1972 | Holmes | 204/24 X |
| 3,651,306 | 3/1972 | Glyptis | 219/233 |
| 3,711,627 | 1/1973 | Maringulov | 174/68.5 |
| 3,743,069 | 7/1973 | Barnett et al. | 192/107 M |
| 3,756,910 | 9/1973 | Peters et al. | 156/166 |
| 3,870,581 | 3/1975 | Afflerbach et al. | 156/192 |
| 4,050,933 | 9/1977 | Sanderow et al. | 75/246 |
| 4,154,429 | 5/1979 | Brannan | 256/10 |
| 4,154,430 | 5/1979 | Pfarr, Jr. | 256/10 |
| 4,157,407 | 5/1979 | Peiffer | 427/54 |
| 4,158,103 | 6/1979 | Danilin et al. | 174/68.5 |
| 4,234,626 | 11/1980 | Peiffer | 427/97 |
| 4,244,994 | 1/1981 | Trainor et al. | 428/37 |
| 4,278,153 | 7/1981 | Venkatu | 188/251 M |
| 4,290,195 | 9/1981 | Rippere | 29/837 |
| 4,370,214 | 1/1983 | Kadija | 204/242 |
| 4,401,519 | 8/1983 | Kadija et al. | 204/11 |

Primary Examiner—G. L. Kaplan
Assistant Examiner—Nam X. Nguyen
Attorney, Agent, or Firm—Finnegan, Henderson, Farabow, Garrett & Dunner

[57] ABSTRACT

Electrically conductive bodies and methods of using same are disclosed which generally incorporate the feature of wire crossing wire at multiple sites of mutual contact throughout the body with the wire interconnected at the sites by a chemical deposition of metal to yield a rigid, open metallic lattice.

21 Claims, 25 Drawing Figures

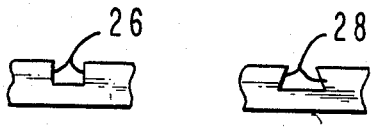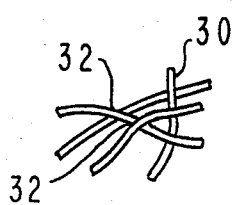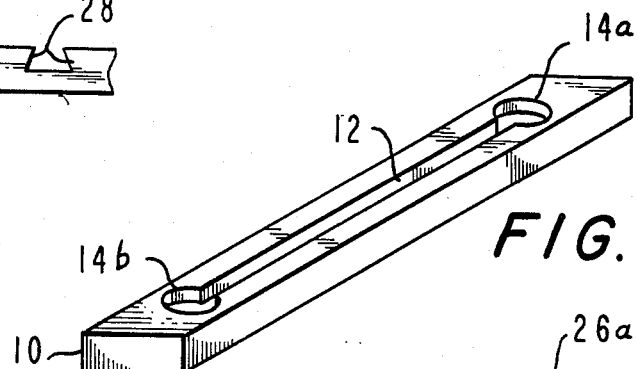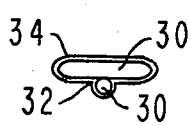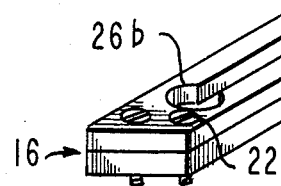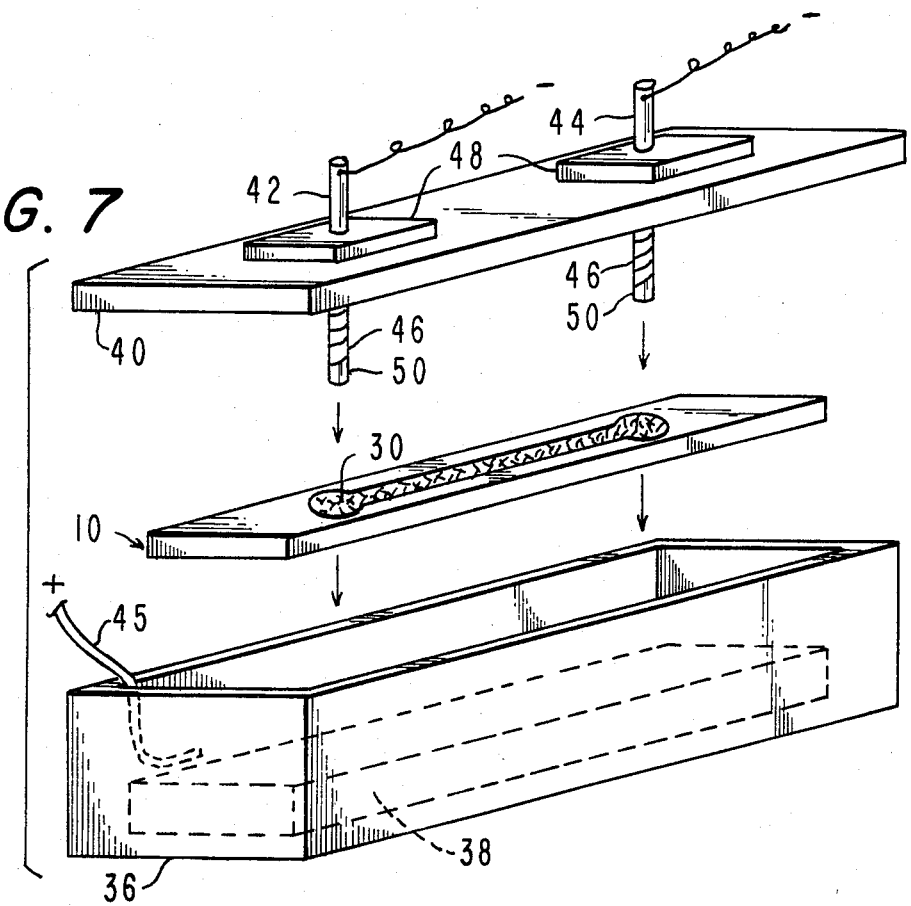

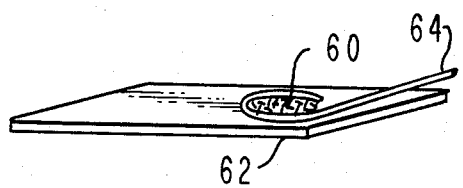
FIG. 8
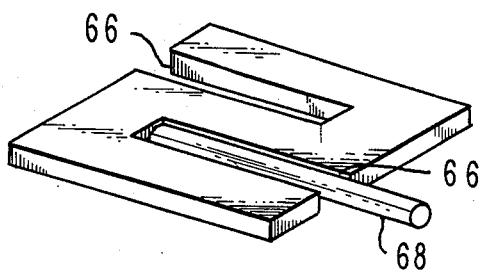
FIG. 9
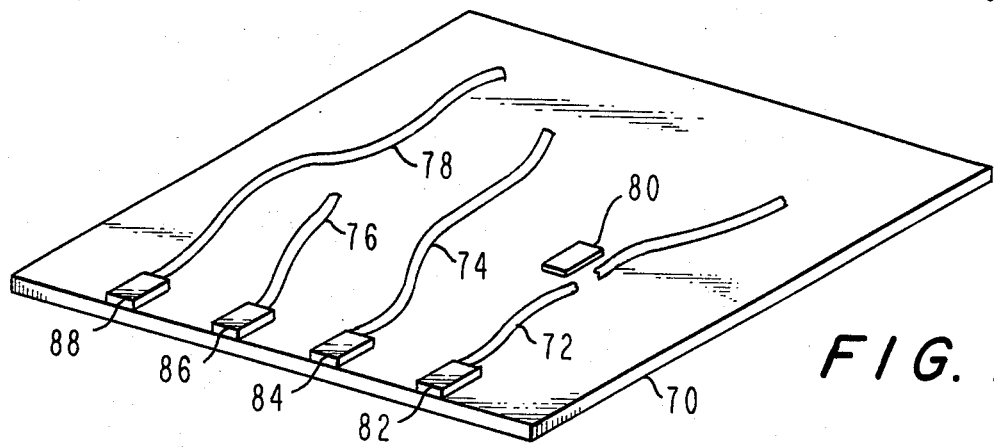
FIG. 10
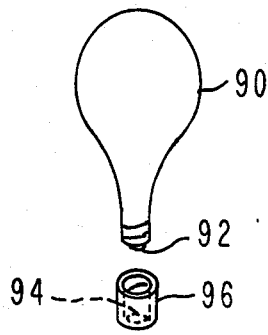
FIG. 11
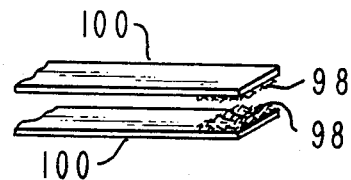
FIG. 12
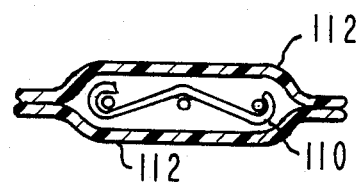
FIG. 14
FIG. 13

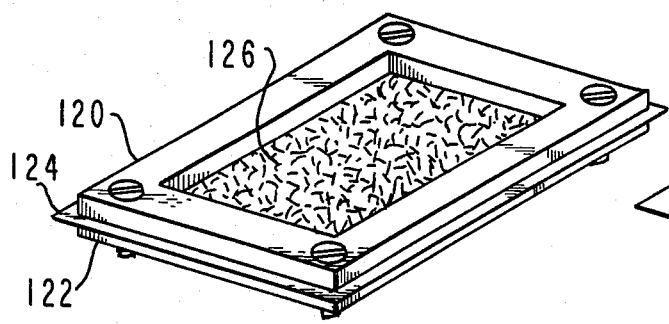
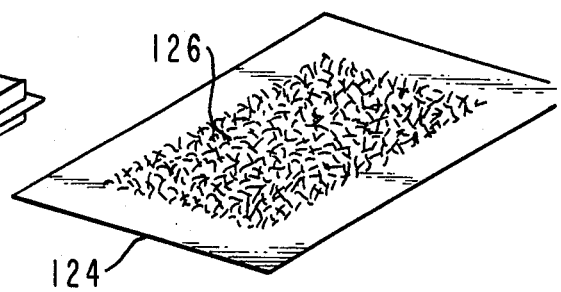
FIG. 15a  FIG. 15b
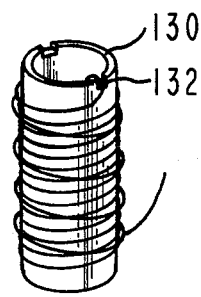
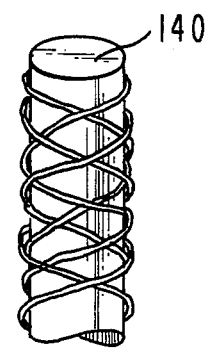
FIG. 16  FIG. 17
FIG. 18
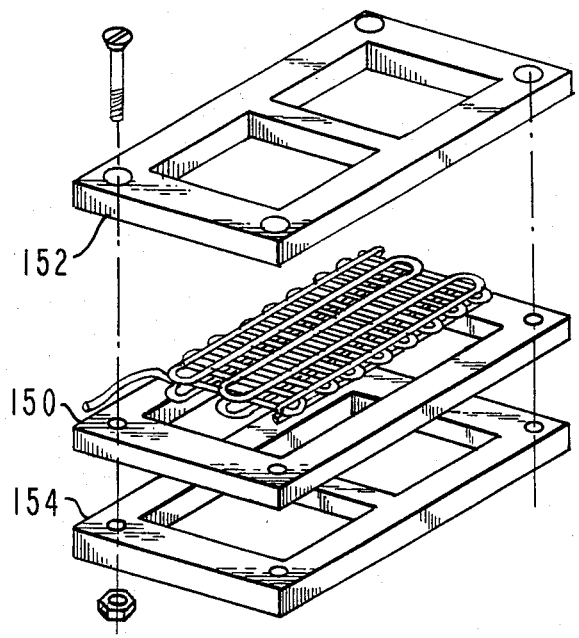
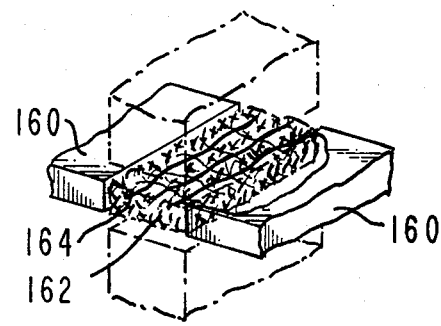
FIG. 19
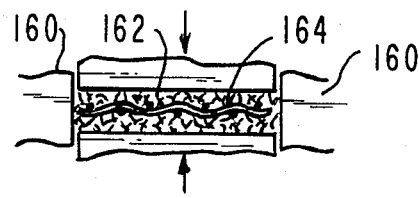
FIG. 20

CONSOLIDATION OF WIRES BY CHEMICAL DEPOSITION AND PRODUCTS RESULTING THEREFROM

BACKGROUND OF THE INVENTION

I. Field of the Invention

The present invention is directed toward electrical conductive bodies and the formation thereof for use as electrical conductors, electrical connectors, electrical contacts, heat exchange surfaces, and supporting grids in various environments, including battery cells and powder compacts such as that used to form disc brake pads.

II. Description of the Prior Art

In addition to the standard metallic wire and circuit board conductors produced by chemical etching, there are many forms of electrical conductive bodies. For example, in U.S. Pat. No. 4,290,195 entitled "Methods and Articles for Making Electrical Circuit Connections Employing Composition Material," the inventor of the subject application discloses use of solder-coated copper powder to establish a conductive body within a printed circuit board.

Other forms of electrically conductive bodies include that shown in U.S. Pat. No. 3,378,629 issued to Rask, wherein a woven conductor is disclosed in which wires at nodal points may be connected by soldering or welding. U.S. Pat. No. 3,414,666 issued to Doundoulakis et al. discloses a woven circuit device in which wires may be welded or soldered at cross-over points. U.S. Pat. No. 3,631,298 issued to Davis discloses connections at cross-over points being accomplished by a dip solder method, by immersion in hot fat dip, or by inductive heating of the conductors. U.S. Pat. No. 3,711,627 issued to Maringulov discloses use of solder connections at contact points. Moreover, U.S. Pat. Nos. 3,474,297 issued to Bylander and 4,158,103 issued to Danilin et al. show various types of conductive matrices, and U.S. Pat. Nos. 3,249,686 issued to Paar, 4,154,429 issued to Brannan, and 4,154,430 issued to Pfarr Jr., disclose use of criss-crossing conductors in a wire netting.

In spite of the wide variety of known electrical conductive bodies and methods of making same, there exist some universal disadvantages. For example, whenever welding is utilized to form a conductive body, the metals involved need to be heated to excessive temperatures thereby imparting potential stress upon the substrate metal. Moreover, the heat typically needs to be applied one location at a time preventing application to large areas at a time by unsupervised operation. Welding also can burn out thin wires or metal sheets. The use of spot soldering or dip soldering involves the same disadvantages.

It is, accordingly, an object of the present invention to provide a new form of electrically conductive body and method of making same which body may be easily and effectively formed without imparting thermal or mechanical stress at joint sites.

Another object of the present invention is to provide a new form of electrically conductive body and method for making same which body may be made basically unsupervised in a manner compatible with large scale commercial operation.

More specific objects of the present invention include providing an improved conductor material; providing an improved form of conductor; providing an improved form of contact; providing a new form of conductive material which has utility as a heat exchange surface; providing a new form of conductive material which has utility in connection with liquid-vapor phase changing; providing a new form of conductive material which has utility as a supporting and conducting grid within an electronic cell; providing a new form of electrically conductive material which has utility as a supporting grid to increase the green strength of a compact before heat consolidation of that compact.

In short, it is the primary object of the present invention to provide a new form of electrically conductive body and method of making same.

Additional objects and advantages of the present invention will be set forth in part in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention, as embodied and broadly described herein, the electrically conductive body of the present invention comprises a rigid conductive matrix formed by an unconsolidated lattice of criss-crossing conductors (such as criss-crossing of wire clippings or such as criss-crossing of long conductors in the form of a wire mesh or screen) followed by consolidation of this lattice through chemical deposition of metal upon the lattice to interconnect sites of mutual contact of the wires throughout the lattice to yield a rigid, open-wire lattice. The form of chemical deposition presently contemplated preferably comprises the process of electro-chemical plating or the process of deposition through chemical reduction, as opposed to non-chemical processes which involve application of thermal and-/or physical stress such as welding or soldering.

The resulting rigid, open-wire lattice has anticipated utility as improved contact points, an improved conductor, as a vehicle for providing repair to an open section of a printed circuit, as a heat exchanger, as a reinforcing member of a clutch pad, and/or as the main structural element for the electrode of a rechargeable storage battery.

Identified in other words, the electrical conductive body of the present invention comprises wire crossing wire at multiple sites of mutual contact throughout the body, with the wire interconnected at sites of mutual contact by a chemical deposition of metal to yield a rigid, open-wire lattice. The wire may be originally formed, prior to consolidation by chemical deposition, of a plurality of randomly oriented individual lengths, of one or more wires formed into a flat screen, of one or more wires twisted at sites of mutual contact, or of one or more wires formed in a regular repeating pattern such as a screen or mesh. Preferably, the resultant rigid, open-wire lattice is between 20% and 90% open volume. This open volume may be filled with a liquid solder, preferably to the point of capillary retention, and-/or filled with solder-coated particles, or serve as a matrice for other purposes.

A preferred method of forming this conductive body comprises the steps of (a) forming an open-wire lattice having at least a 20% by volume void within the bounds of that lattice; and (b) rigidifying that lattice by chemically depositing a metal upon the lattice to bridge sites of mutual contact of the wire within that lattice. The step of forming may include obtaining a form which outlines the desired shape of the lattice and loading that form with randomly oriented lengths of wire which are sufficiently short to leave at least a 20% by volume void within the form. A metal plate may be secured to one surface of the resulting lattice during the step of chemical depositing by first using that plate as a supporting surface of the form.

DESCRIPTION OF THE DRAWINGS

The accompanying drawings, which are incorporated in and constitute a part of the specification, illustrate examples of a preferred embodiment of the invention and, together with the general description of the invention given above and the detailed description of examples of the preferred embodiment given below, serve to explain the principles of the invention.

FIG. 1 is a pictorial representation of a form used in accordance with the teachings of the present invention;

FIG. 2 is a pictorial representation of another form used in accordance with teachings of the present invention;

FIGS. 3 and 4 are cross-sectional views of forms suitable for use in accordance with the teachings of the present invention;

FIG. 5 illustrates a number of wire clippings;

FIG. 6 shows wire clippings bridged with a deposited metal;

FIG. 7 illustrates an exploded view of a plating tank suitable for use in accordance with the teachings of the present invention;

FIG. 8 illustrates a connection utilizing the teachings of the present invention;

FIG. 9 illustrates another form of connector utilizing the teachings of the present invention;

FIG. 10 illustrates a circuit board repaired in accordance with teachings of the present invention;

FIG. 11 shows a bulb and socket incorporating the teachings of the present invention;

FIG. 12 illustrates contacts utilizing the teachings of the present invention;

FIG. 13 illustrates a flexible connector constructed in accordance with the teachings of the present invention;

FIG. 14 is a cross-sectional view of a flexible connector incorporating the teachings of the present invention;

FIG. 15a and b illustrate one form of lattice incorporating the teachings of the present invention which is suitable for use as a heat exchanger surface;

FIG. 16 illustrates another form of heat exchange surface constructed in accordance with the teachings of the present invention;

FIG. 17 illustrates a matrix incorporating the teachings of the present invention;

FIG. 18 illustrates an exploded view of a form designed to receive layered bent wires in accordance with the teachings of the present invention;

FIG. 19 is a perspective view of a die for powdered metals in which a reinforcing grid is utilized in accordance with the teachings of the present invention;

FIG. 20 is a cross-sectional view of the die shown in FIG. 19;

DETAILED DESCRIPTION OF THE PREFERRED EMBODIMENT

Figure 21:
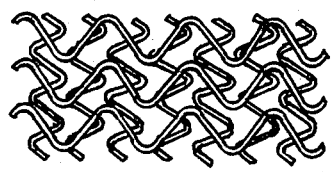
FIG. 21 illustrates one form of heat exchange surface incorporating the teachings of the present invention.

The basic foundation of the electrically conductive body of the subject invention is a matrix of wire crossing wire at multiple sites of mutual contact followed by bonding at the sites of mutual contact through the process of chemical deposition of a metal to yield a rigid, open-wire lattice. The matrix of wire crossing wire of the subject invention may comprise short lengths of wire, for example, copper wire, in random orientation with regard to one another. Long lengths of wire (or even a continuous length of wire), such as copper wire, may instead randomly be positioned or folded back upon themselves, to form sites of mutual contact, or long lengths of wires or a continuous wire may be regularly oriented in the form of a screen or mesh having a basic repetitive pattern, again forming sites of mutual contact at cross-over points. In each of these embodiments, the wire is interconnected at the sites of mutual contact by a chemical deposition of metal to yield a rigid, open-wire lattice.

The first of these embodiments, utilizing short lengths of randomly oriented wire, is preferably constructed using a form as illustrated by reference numeral 10 in FIG. 1. Form 10 is preferably constructed of fiberglass cloth and epoxy, for example on the order of 1.5 millimeters thick, or of fiberglass roving and Teflon ®, for example on the order of 6 millimeters in thickness. In either case, a groove 12 is cut out of form 10 to confine short lengths of wire in a desired shape. As shown in FIG. 1, groove 12 may have an elongated shape with land areas 14a and 14b at either end.

Form 10 may be formed of a single piece of insulation or of one or more layered pieces of insulation. For example, in FIG. 2 a form 16 is illustrated comprised of two layers of insulation 18 and 20 placed one on top of the other and held together by stainless steel bolts 22. Adhesives or the like may be used in place of bolts 22. In FIG. 2, layer 18 is cut through, for example by die-punching, to form a groove 24 and land areas 26a and 26b. When layer 18 is assembled upon layer 20, the upper surface of layer 20 forms the bottom of groove 24.

Grooves 12 and 24 may either have a rectangular cross-sectional area as shown by groove 26 in FIG. 3, or a tapered cross-sectional area as shown by groove 28 in FIG. 4. When using a tapered cross-sectional area as shown in FIG. 4., groove 28 operates to hold a conductive body formed within that groove.

The roughness of the walls of the grooves will also assist in anchoring the conductive body.

Making reference again to FIG. 1, groove 12 with land areas 14a and b are loaded with randomly oriented lengths of wire which are sufficiently short to leave at least a 20% by volume void. Preferably, jumbled short lengths of wire are rapidly poured into form 10 with movement along the form. These wires are preferably poured from a narrow orifice so that a degree of openness of internal structure is obtained. The resulting unconsolidated structure form 10 is more of a jack-straw type heap than an orderly parallel array. Once such an open internal structure has been attained, it should not suffer disruption to cause a decrease in internal openness before deposition of metal thereupon has been accomplished. After deposition of metal, the open internal structure assists complete rinse out of chemicals used to clean the wires and/or for the deposition of metal onto the wires. These chemicals, if present even only in traces, can lead to later corrosion.

Suitable short lengths of wire may be obtained from copper commercial lamp cord of 18 A.W.G. variety. Individual strands of such a cord measure 6 to 8 mils in diameter. The wire, after removal of insulation, may be soaked in a 50—50 sulfuric acid-water solution for at least one hour and then rinsed and dried. The 6 to 8 mil copper wire, as a bundle of approximately 40 wires, may be held together and then clipped with sharp shears. Sizes ranging from 1 to 2 mm are preferable when the dimensions of the form utilized exceed 2 mm. It is preferable that in no event does the length of the clippings exceed the shortest dimension of the form. To do so would encourage the clippings to align with regard to one another and defeat the object of obtaining a random orientation. Any length of clippings greater than the width of the form, or just under the width of the form, tends to cause the clippings to line up with one another in parallel with the longitudinal axis of the form. This gives many individual lengths of wire resting closely along and against each other to decrease internal openness of the resultant array. Moreover, the manner in which the clippings are arranged within the form tends to control the overall initial resistance to flow of plating current. To achieve uniformity from one batch to the next, it is, therefore, desirable that a random orientation be consistently achieved.

As might be expected, the diameter of the wires determines the numbers of clippings per unit mass of wire, thus determining the number of contact points between all wires within the form. This number is a factor in the overall resistance along the conductor during the initiation of a plating operation upon the wire clippings.

In accordance with the present invention, clippings of the general nature described above, are rigidified by chemically depositing a metal upon the clippings to bridge sites of mutual contact and thereby consolidate the clippings into a rigid, open wire lattice. More specifically, as shown in FIGS. 5 and 6, a plurality of clippings 30 when randomly oriented within the forms shown in FIGS. 1 or 2, or the like, have a plurality of sites of mutual contact 32. When an additional metal 34 is chemically deposited upon wires 30, additional metal 34 tends to bridge sites 32, as shown in FIG. 6, thereby forming a rigid structure.

The chemical deposition may be accomplished, for example, by electro-chemical deposition or by chemical reduction. In the case of electro-chemical deposition, utilizing the forms illustrated in FIGS. 1 and 2, one may employ a plating tank such as tank 36 illustrated in FIG. 7. Tank 36 may be constructed of fiberglass-epoxy sheets using baked epoxy cement. A loosely fitting bench 38 may be employed within tank 36 in order to bring forms placed within tank 36 closer to the surface of a solution contained within tank 36, and to enhance visibility in positioning electrical contacts vis-a-vis such forms.

As shown in FIG. 7, form 10 of FIG. 1 may be placed within tank 36 on bench 38. To make electrical contact with wires 30 randomly charged within form 10, a cover 40 of tank 36 engages two conductive electrodes 42, 44. These electrodes may, for example, comprise solid copper rods of 5 mm diameter. It is preferable that electrodes 40, 42 be wrapped with platers tape 46 for insulation against plating. Electrodes 42, 44 may be mounted to cover 40 by any suitable mounting means such as by use of insulating blocks 48, provided the extreme lower ends 50 of conductors 42, 44 are properly aligned with regard to form 10, to engage wires 30 with form 10 and thereby permit a flow of electric current through wires 30. The ends 50 of electrodes 42, 44 are free of insulation so that contact can be made to the wires 30 in the form 10.

Electric current to electrodes 42, 44 may be provided by any conventional electric circuit, such as a 12 volt storage battery. A resistive wire rheostat may be employed to control the current supplied to electrodes 42, 44. An anode 45 fits into tank 36 along the bottom, or along a side wall.

To achieve electro-chemical deposition of metal upon wires 30, plating tank 36 is filled with a plating solution. For example, when wires 30 are of copper, an acid plating solution of copper sulfate (70 g/liter); sulfuric acid (175 g/liter); chloride (50 ppm); and other agents, such as Lea-Ronal copper gleam p.c. (1%) may be utilized. This illustrative solution is cathodically 100% efficient at 30 amps per square foot, averaging 1 mil buildup in 36 minutes. The Lea-Ronal p.c. additive for acid copper plating yields fine grained deposits with good ductility and other properties favorable to use in the printed circuit industry. Tri-isopropanolamine at about 7 g/liter is also a suitable additive for producing fine grained copper deposits from acid solutions. Other bath additives or compositions, such as copper pyrophosphate, that are currently used in industry, could also be used as part of the plating solution for tank 36.

An electro-chemical deposited coating of metal should not be confused with a coating created by a dip into molten metals, such as a coat of zinc on iron wire, generally recognized as producing galvanized wire. The electro-chemical deposition coat is continuous and uniform, and can attain a previously selected thickness from a wide variety of metals which offer choices based on electrical resistance and compatibility with environmental conditions. Moreover, successful coatings can be employed to combine strength, protection, and economy. In this fashion, the electrochemical deposition coating used in connection with the subject invention is capable of a variety of engineering functions. For example, a second coat may employ a low resistivity metal, such as silver, in order to reduce the resistance of the resultant conductor when used in connection with high frequency signals.

Moreover, it should be understood that through use of a chemical deposition process, such as electro-chemical deposition, the wires forming the resultant structure are not subjected to substantial thermal or physical strain, as they are in connection with a dip in molten metal, soldering, welding, or other known forms of interconnecting metal wires. Accordingly, a randomly oriented matrix of short wire clippings is maintained in its original configuration throughout the deposition process when chemical deposition of a coating metal is utilized, whereas such random orientation would be subjected to mechanical and/or thermal stress if placed in a dip of molten metal or the like.

The electro-chemical deposition generally described above and described more specifically below in connection with the following examples, was conducted in a water solution where the metal was transferred in ionic condition by an electrical potential difference to its target location. In this sense, there is a parallel technology which can be used to produce the same final structure and, accordingly, is intended to come within the scope of the present invention. In this technology the metal is in an atomic, not ionic, condition and moves through a region of reduced pressure. Such a metal is directed to a target by a potential difference of field established through use of the target as one electrode. The usual terminology of such a technology is accelerated vacuum deposition. On the basis of this parallelism, the term chemical deposition, and more specifically, the term electro-chemical deposition is intended to include this technology.

Electroless metal deposition, namely through chemical reduction, is also considered to come within the scope of the present invention. For example, electroless deposition of copper from alkaline solutions is a catalytic reaction initiated upon metal such as palladium or upon copper itself, where the reaction is classified as auto-catalytic. Using a commercially available solution, the reaction is generally accepted as becoming selfterminating at about 20 micro inches of thickness. Frederick A. Lowenheim in the Third Edition of "Modern Electroplating" (John Wiley & Sons, 1974), which is hereby incorporated by reference, on page 736 cites compositions for six additional such baths. Generally they contain: $CuSo_4 \cdot 5H_2O$ 3 to 29 g/l. Sodium potassium tartrate 25 to 150 g/l and Formaldehyde 10 to 160 g/l Sodium Hydroxide 4 to 50 g/l. Again, such processes do not subject the basic wire unconsolidated matrix to mechanical or thermal stress, and yet achieve the desired result of providing a bonding of sites of mutual contact throughout the lattice to thereby consolidate the lattice into a rigid, open-wire structure.

As may be noted from the examples given below, the resultant rigid, open-wire lattice may be maintained within a substrate such as form 10 either by use of the tapered configuration such as shown in FIG. 4 and/or, by later use of insulative adhesives. In either event, form 10 may take the place of a printed circuit, with channel 12 providing the requisite conductive paths within that circuit. In such a case, the resultant rigid, open-wire lattice of the subject invention takes the place of the traditional copper circuit board conductors. As shall be understood from the following specific examples, the subject invention is not limited to the use of randomly distributed wire clippings charged within a form as illustrated in connection with FIGS. 1–6. As may be realized from the examples set forth below, the random wire clippings may be replaced by various forms of wire matrices including screens and flat cables. In order, therefore, to more clearly comprehend the scope of the subject invention, attention is directed toward the following illustrative examples.

EXAMPLE A (Conductor)

A slot 1 millimeter wide, widening to 2 millimeters and 50 mm long was cut in a first sheet of 1.5 millimeters thick form material. This first sheet of form material was joined to a second whole sheet of form material which acted as a base. The resultant form was charged with 0.15 cm³ of 1 to 2 mm clippings of 6 mil wire. The clippings were distributed evenly along the slot, and copper was electro-deposited at 0.18 volts and 75 m.a. for one hour. The resultant structure was then rinsed well with sulfuric acid, water and finally alcohol. The copper clippings of wire were observed to be completely consolidated and retained in the slot, even when the slot was inverted. The resultant structure was found to be internally porous with full access from all along the top of the slot. Calculations based upon the volume of clippings, and therefore the apparent density and Faraday's Law indicated a 69% void space in the original charge of random clippings, and a plating weight increase of 21% to cause adequate consolidation in the lattice coupled with ease of rinse-out. The original copper wire of 0.42 g weight was plated for 4.50 ampere minutes to deposit 88 milligrams of additional copper.

EXAMPLE B (Conductor)

A second two-layer form with a slot 4 mm wide extending to 5 mm wide at the bottom was charged to a depth of approximately 1 mm with 1 to 2 mm clippings of 6 mil copper wire, then plated at 28 milliamperes for a total of 3.0 ampere minutes. The original copper wires were found to be 2.5 times by weight that of Example A and that of the deposited metal was found to be only 2/3 of the deposited copper of Example A. An approximate calculation of the plated-on copper ratio to original copper is 5.5%. In summary, the original copper had a weight of 1.0 grams and the plated copper a weight of 60 milligrams or about 6% of the weight of the original copper.

EXAMPLE C (Conductor)

A form was milled into polytetrafluoroethylene (PTFE) material, 4 mm wide and 50 mm long, with vertical walls expanded at the base. This form was charged with 0.35 cm³ of 1 to 2 mm clippings of 6 mil copper wire, giving a depth of fill of 1.5 mm. These clippings were plated at 30 milliamperes for a total of 5.15 ampere minutes. After rinsing, the wire clippings were found to be stabilized into an open but rigid lattice structure. Calculations revealed that the weight percentage of plated-on copper was 10%. It is believed that once a 5% weight increase has been achieved, the discrete clippings have been sufficiently consolidated to permit shifting of the form from a horizontal orientation to a vertical orientation to permit continued plating and thereby permit continued strengthening. However, with the form in a vertical position, an increased economy of space is achieved within the plating tank. Upper limits for weight pick-up by plating have not been established. However, the upper limit would appear to be that at which rinse-out of electrolyte is interfered with.

EXAMPLE D (Conductor)

A mold having a slot 50 mm by 6 mm was charged with 1 to 2 mm clippings of copper 6 mil wire and submerged horizontally in 400 milliliters of electroless copper deposition solution and left for 24 hours. The form was removed and rinsed gently. The wire clippings were interconnected so well that the form could be held vertically without disturbing the wires.

Plating was then started with the form held in a sloping or tilted position. Plating current at 40 milliamperes was applied at 0.12 volts. After 90 minutes of plating the wires were found to have lost their initial consolidation to each other and slid under gravity into the bottom of the form, where they became reconsolidated.

The electroless copper deposition procedure was repeated followed by an electrode deposition phase carried on at only 4 milliamperes with a horizontal frame orientation, for a period of about 20 hours. The wire consolidation was adequate and the original random orientation was not disrupted.

DynaChem "Electroless Copper" process is a commercially available composition supplied in two solutions. One has the copper and complexers and the other has alkaline and reducing agents. Using DynaChem, or the like with one part A plus 8 parts water plus one part B, the reaction becomes self-terminating at about 20 micro inches of thickness. With the film at the cross contacts having this thickness, its resistance is high and its current carrying capacity limited. Accordingly, it is hypothesized that 40 milliamperes was high enough to "burn out" or "blast out" this thin film. A 4 milliamp current was safe, so that plating could proceed.

With proper respect for the properties of the materials being processed, this electroless metal deposition method appears satisfactory. There are fast and heavy build solutions where 1/10 mil. (0.0001 inch) of copper can be deposited from a hot solution in an hour, or other metals such as nickel can so be deposited. These methods are feasible but not preferable at the present time, due to the introduction of potential thermal strain upon the unconsolidated random structure, and disruption resulting from bubble formation.

EXAMPLE E (Connections to Copper Lattice)

A form similar to that used in Example B above, but with two additional land areas evenly spaced along the conductor was prepared, loaded with 0.3 cm³ of 1 to 2 mm wire clippings from a 6 mil copper wire and copper deposited at 34 milliamperes for 6.8 ampere minutes. After rinsing and drying there was a stable, open lattice of copper formed by the consolidated copper clippings. However, it was found that any pressure on the pads tended to disrupt the structure of the copper clippings.

A very good connection was made by fluxing the copper lattice, then applying solder and heat. A 20 gauge copper wire was joined to the landings, and after cooling the lattice resisted tugging on the wire to the extent that the conductor was lifted slightly from the bottom of the slot to which it returned upon easing the tension.

The deposited copper was approximately 15% of the weight of the original copper, within the ranges of Examples A, B, and C above. The structure was self-supporting, but unable to stand several hundred pounds per square inch of pressure. The structure was adequate to withstand the process of soldering and exhibited some degree of resistance to pull. A degree of flexibility was also noted as the conductor could be lifted away from the base to which it returned when the pull was released. The original weight of the copper was 0.84 grams with 0.13 grams of plated-on copper applied thereto.

EXAMPLE F (Copper Lattice With Copper Powder and Solder Fill)

A second form was prepared similar to that of Example E and solder-plated spherical copper powder was added to the land area before flux, solder and heat. The molten solder wetted the lattice and also the copper powder to produce a solder surface backed up by copper distributed just beneath its surface. It was noted that the molten solder was limited in spreading out along the conductor from the land area, filling in the porosity of the lattice.

This connection was significant for two aspects. First, the flow of molten solder demonstrated restrictive spread, and second, the applied solder could be reinforced physically by incorporation of particulate copper, such as spherical copper powder particles. This reinforcement also enhances the conductivity of the overall interconnection.

EXAMPLE G (Copper Lattice With Solder Fill)

A form with a 50 mm by 20 mm opening was charged with 0.90 cm³ of 1 to 2 mm clippings of 6 mil copper wire. The weight of the copper wire clippings was 2.25 grams and the included void space within the form was 0.65 cubic centimeters or 70% of the total volume. The copper clippings were plated for 4 hours at 38 milliamperes for weight gain of 0.145 grams or 6.5%. After rinsing and drying, flux, solder and heat were applied. The lattice was then held vertically with the molten solder at the upper edge. The molten solder ran down the lattice until the solder was held from spreading farther by capillary action, and no farther. Additional solder and flux were again applied until the entire matrix was filled with solder, with capillary action restraints setting the limit. The final weight was 6.92 grams.

The lattice was released from the upper layer of the mold after copper plating and before solder application. This solderfilled lattice was found to cut readily with a jewelers hand-saw; to form readily by file, rotary carbide burr, or rotary abrasive disk and drill; and to solder readily to a tinned surface by melting of the integral solder, and without draining of that solder, and without spread onto the tinned surface or requiring the supply of additional solder.

This copper lattice had only a 6.5% weight addition by copper plating and a void space of about 70%. The lattice accommodated over 200% by weight of solder to fill the lattice volume. This material was found to be amenable to various types of tools that shape other materials. Close side-by-side positions of the soft solder and hard copper was found to have an effect upon the chips produced, they did not gall, smear or clog saw blades. Working this material was found to be easier than working solder alone.

EXAMPLE H (Connector)

A 2 millimeter square was cut from the material produced by Example F. Two ends of 20 A.W.G. copper wires were brought to opposite sides of the square, fluxed, and heated with an iron until the solder became molten and wetted the wires. On cooling, a solid joint resulted. This type of joint was hard to make as the wires would slip away from the block. This joint, however, was found to be practicable since the solder did not escape. The joint was most easily achieved when both wires were pressed against the block of Example F material and the iron applied.

EXAMPLE I (Connector)

As shown in FIG. 8, a 3 mm block 60 was cut of Example G material and soldered by its integral solder to a strip 62 of 10 mil thick copper. A partial loop or hook 64 was formed in 20 A.W.G. copper wire to fit block 60. Flux and heat were applied, and wetting established. On cooling, a firm connection was found. This type of connection could be made easier than that illustrated by Example H. The wire can substantially loop around the block and be soldered easily.

EXAMPLE J (Connector)

As shown in FIG. 9, a 5 mm block of Example G material had cut into it two 1 mm slots 66 to form a crude block letter S. Two No. 20 A.G.W copper wires 68 (one shown) were inserted one into each slot. Flux and a heated iron were applied to create wetting of the copper wires by the integral solder. On cooling, a strong joint, without solder runs, was obtained. This example is viewed as an improvement over Example I.

EXAMPLE K (Connector)

Two blocks of 3 mm by 5 mm material were cut from Example G material and superimposed on one another. From opposite sides the ends of two 20 A.W.G. copper wires were inserted between these blocks. The wires were fluxed and a heated iron applied to the flux until wetting was observed, then heat was removed. Again, a strong joint resulted. This type of joint can be improved by drilling holes through a block of Example G material. On heating, the block will not collapse.

EXAMPLE L (Connections-Circuit Board Repair)

In FIG. 10 there is illustrated a printed circuit board 70 having a number of copper conductors 72, 74, 76 and 78 constructed by known prior art technology. Conductor 72 was severed by a cut 15 mils thick to simulate a scratched open surface. A block 80 of Example G material was cut approximately 10 mm long and 4 mm wide and thick to have approximately the same width as conductor 28. Soldering of block 80 to conductor 72 across the cut therein was accomplished by holding one end of block 80 with tweezers, positioning block 80 symmetrically across the damage and applying a heated iron to the other end of the block. As the iron heated the block, the solder within that block became molten at its under surface. With removal of the iron, the solder solidified and a joint was made.

The metal tweezers used to hold block 80 served as a heat sink at one end of block 80. The tweezer held end remained cool enough for the solder not to melt. By interchange of the iron and tweezers and again applying heat a second solder joint was made. The repair was finished by dressing the block down to 1.5 mm in height above the board. There was no run or spread of solder beyond the contact between the block and the circuit conductor 72. The two ends of repaired conductor 72 had clearance of less than 2 mm between neighboring conductors at the site of the repair. Accordingly, this process is useful for making repairs in close space on conventional printed circuit boards without danger of running of uncontrollable solder. Thus this method provides a significantly advanced tool for field repairs. As long as there is access to the site with tweezers and an iron, a repair can be successful.

EXAMPLE M (Finger Contacts)

Printed circuit board 70 of FIG. 10 was originally edged along one side with expansion of conductors 72, 74, 76 and 78 intended to operate as finger contacts. Such finger contacts were conventionally completed by first stripping the etch-resist coating over the copper, then plating nickel, and finally plating gold. The finger contacts were 1.2 mm wide with identical spacing between them. The fingers were 6 mm long.

In place of the conventional finger contacts, blocks of Example G material 82, 84, 86, and 88 were cut to 6 mm in length, and about 3 mm in width and thickness to match the width of the finger contacts. Held by tweezers in position, each block was soldered into place onto a finger without any running or bleeding of solder. Four adjacent contacts were so treated. Finally, the blocks were dressed for uniform height of 1 mm and the leading edge was beveled to provide a ramp for a clamp contact with which each would couple.

A solder-filled copper lattice of the subject invention can be a less expensive replacement for gold plating over nickel plating over copper foil in circuit board edge contacts. The presence of a copper matrix with interior soft solder will serve to keep the solder from being deeply scored and grooved by the mating contact. A harder solder or alloys can be used to fill in the lattice.

Although the finger contacts described above can be placed by properly designed jigs and automatic soldering, in the alternative the lattice can be formed directly on a circuit board as an integral part of the circuit or on a separate strip of board to be attached later to the circuit board.

EXAMPLE N (Contact)

There is shown if FIG. 11 an electric light bulb 90 (110 volt, 60 watt) for household service which was provided with a 3×3 mm block 92 of Example G material soldered to the central contact of lamp 90. A similar block 94 was also soldered to the contact making point of a socket 96. No interference in the normal operation of the combination was observed.

Such contact using a solder filled copper lattice at a bulb base can have direct application in panel or dashboard indicator lights where a flat flexible circuit can be used without wiring or solder leads to the lugs of socket. For service in which there is a frequent change of bulbs, the copper dispersed throughout the contact material will prolong the service life of the contact.

EXAMPLE O (Relay Contacts)

A double pole, double throw relay for 120/240 volt AC service was modified by replacement of various contact making buttons with equivalent blocks of Example G material 98 as shown in FIG. 12 wherein such buttons 98 are shown located on contact arms 100. The relay subsequently was observed to operate in a normal fashion, with some lateral wiping of contacts across one another. Upper current operating level may be increased by providing a higher melting alloy than 60–40 tin lead solder as the lattice filler or by adding heat sinks to the contacts.

EXAMPLE P (Flexible Conductors)

A narrow strip of woven copper conductor was made of three lengths of 0.005 inch copper wire placed about 6 millimeters distant from each other as shown in FIG. 13. A fourth piece of copper wire 110 was passed over and under the three original wires at 120 mm intervals to provide a weave. This "weave" was plated at 38 milliamperes for 8.5 ampere minutes. After rinsing, the weave was found to be rigid and had some degree of flexibility. Thereafter, the consolidated weave can be imbedded in layers of insulation 112 as shown in FIG. 14 to form a resultant flat cable. Moreover, the open mesh of the weave permits laminating adhesive to pass therethrough, and/or solder plating may also pass through the mesh to reinforce and further strengthen the weave.

In producing large amounts of narrow, flexible flat conductor for laminating into flexible cables, several options in design of conductors are possible. For example copper screen cloth, in appropriate widths, can be rolled to give greater area of contact at crossovers, electroplated with copper, electroplated with solder, then dipped in an oil heated above the melting point of the solder plate. After this processing, narrow strips of mesh can be slit out of the greater area of mesh for laminating into cables.

EXAMPLE Q (Integral Heat Exchanger Surface)

As shown in FIG. 15(a) a form with a 50 mm by 20 mm opening was constructed of upper and lower sections 120, 122. A thin sheet of copper 124 was sandwiched between upper and lower sections 120, 122. Copper sheet 124 had been cleaned to a breakfree film of water on rinsing, then dried. The back of copper sheet 124 and edges were previously protected with plating tape before being clamped between layers 120, 122. The resultant form 126 was charged with 2.20 grams (0.90 cm$^3$) of one to two mm copper wire clippings and plated with an acid copper solution at 41 milliamperes for 14.0 ampere minutes to deposit 0.27 grams of copper. This gave a 12% weight increase upon the randomly arranged copper wire clippings in form 126. The array of copper was rinsed, then soaked for 30 minutes, rinsed again with water, then alcohol, then blown dry. The resulting lattice, shown in FIG. 15(b), was stable and remained untarnished.

The resultant lattice provides a heat exchange surface in which heat is transferred across a solid-state gas interface. Such exchangers are dependent upon conduction of heat along a metal body to an expanded surface where the heat is transferred to air or other gas. Spacial and material economy indicate that effective design is one which maximizes the ratio of the surface area of the exchange interface to the metal cross-section or to the unit mass of metal, and also relates to the exchange area to unit volume. The heat exchange surface shown in FIG. 15 offers compactness, sturdiness, high area to volume ratio with continuous metal integral structure. The electro-chemical deposition of metal produces a continuous, metallic joint between the base and the less dense randomly oriented material.

EXAMPLE R (Integral Heat Exchange Surface)

As shown in FIG. 16 a 2.5 inch length of ⅜ inch outer diameter copper pipe 130 was cleaned with abrasive paper, then wound with No. 22 A.W.G. copper wire which was first passed through a slot 132 cut in the end of pipe 130. The wire was then wound with 25 turns in a first layer, then 5 turns in each of the next of 4 layers and terminated in a lead for plating. The ends of the pipe were sealed with insulation. There were 8.0 grams of copper wound onto the pipe. Plated at 1.0 ampere for 3.5 amperehours, a calculated weight increase of 4.1 grams of copper resulted. The structure was stable and rinsed well.

EXAMPLE S (Wire Winding on Insulating Cylinder)

Referring generally to FIG. 17, a 4 inch length of ⅝ inch diameter wooden dowel 140 was wound with a double layer of insulating platers tape. At a distance of about 2 inches apart, two sets of holes were drilled through the dowel [not shown]. A copper wire of No. 12 gage was forced through one of these holes and clipped off ⅛ inch above the surface of the dowel, to serve as an anchor peg for windings of copper wire. Starting at one peg, 120 inches of No. 22 A.W.G. wire was wound with about 5 turns to the 2 inch section. Nine layers were wound over each other in a diamond shaped opening pattern, with 4 inch leads at both ends. This diamond pattern is generally illustrated in FIG. 17.

The diamond pattern array was plated at 1.0 amperes with a surface concentration of 30 amperes per square foot of plating area (AFS) for two hours to give approximately a 4 mil build up on the surface of the wire. The resultant consolidated array drained and rinsed well. The final cylinder, after trimming leads and peg windings, was 55 mm long, 16 mm in internal diameter, and approximately 2.5 mm thick.

The resultant matrix has direct application to a heat exchange surface of a tinned copper pipe, although other applications can be projected. Electro-plated nickel or tin would also provide corrosive resistance against moist air or liquid coolant. A matrix with different materials might include iron wire with electro deposition of iron for strengthening followed by nickel plate depositon for corrosive resistance.

EXAMPLE T (Layered Bent Wires)

Three 20 inch lengths of No. 22 A.W.G. copper were bent in 180 degree turns to give ⅛ inch spaces between adjacent runs. The lengths were chosen to be such as to fit within a 50 mm by 20 mm opening in a mold sheet 150 as illustrated in FIG. 18. Two pieces were bent with 5 turns, for longitudinal fit. A third piece had 15 turns for transverse fit. All pieces were layered to give 90° crossings between layers and clamped between top and bottom mold sheets 152, 154, using middle mold sheet 150 as a separator.

The resultant assembly was plated at 0.2 amperes for a total of 2.5 ampere-hours to give a pick-up of 3.0 grams of copper on a 5.0 gram original assembly. The resultant consolidated matrix rinsed well, was strong, rigid and could be bent ⅛ inch without breaking or cracking.

This example is given to shown general usefulness of an alternative assembly utilizing an array based upon continuous wire sections and not short wire clippings. This example is also illustrative of a design which will enable plating in a hanging position in a tank, thus decreasing production area alloted to the electro-deposition stage. Calculations show that for this non-restrictive example:

plated on copper: 50% weight gain on original copper;
volume of matrix: 1.62 cm$^3$;
volume of copper: 1.05 cm$^3$;
percent of volume of copper: 65%; and
percent volume of enclosed space: 42%.

Applications for sheets of such matrix material would be heat exchange surfaces, humidifier membranes, or either flat or curved spines to strengthen powdered metal molding in the presintered state.

More specifically, friction materials of metal, such as clutch plates or brake band linings have been designed to be benefited by special properties that can be obtained from powder metal metallurgy fabrications. In such instances powdered metals are pressed to shape in a die, then heat bonded and partially alloyed to yield a heterogeneus metal body, unobtainable by conventional metallurgy. The desired end products are shaped to final form by pressure applied to the mixed powders of the metals, which usually include copper. As the products are usually not over 5 millimeters thick, they are tender and fragile, requiring careful handling to avoid fracture as "green strength" is low before heat treatment.

In this area there is an opportunity to use a matrix screen as shown in this example, and which has, previously, been rigidified by metallic deposition, in one or more separate layers, within the powder filling of a die to give internal strength to the comapct in the "green stage." For example, as shown in FIGS. 19 and 20, there is a die 160 in which frictional material 162 is positioned to be pressed into shape. Prior to such pressing, there is introduced a metal screen or mesh 164 manufactured in accordance with the teachings of the present invention. The application of this rigidified mesh is projected directly to clutch materials and brake band linings and materials. The matrix beneficially strengthens a powder compressed in a form and permits the powder to be subjected to transfer from die 160 to a heat processing location without the high percentage of fracture due to low "green strength" as has heretofore been experienced.

EXAMPLE U (Heat Exchange Surface)

Several 12 inch lengths of No. 22 gaged copper wire were wound in close coils on a ⅛ inch steel rod, then extended to 10 inch lengths and flattened to a shape suggesting the graph of a trigonometric sine or cosine function. Fifteen 2 inch sections were cut from these 10 inch pieces. A form sheet with a 50 mm by 20 mm opening was placed above an insulating base and then loaded with three layers of these pieces. The first layer had 6 lengths, the second also 6 lengths, which by rebending were shortened to ¾ inch to fit across the form, a top layer had 3 wire lengths. Before placing in the form each piece of wire was flattened so that when placed on a flat surface, no light could be seen between the wire and the surface. The array was plated at 0.2 amperes for 2.4 ampere-hours for an additional 2.8 grams on a 5.3 gram base. The resultant matrix rinsed well, was readily removed from the form and could withstand flexing ¼ inch without fracture. An illustration of the resultant matrix is shown in FIG. 21, which shows schematically only two alternate layers.

As may be seen in FIG. 21, this particular array exhibits a large interior spacing between adjacent wires. This example reveals the need to keep individual pieces flat and clamped in order to maximize the strengthening given by the electrodeposited metal. Curves in the pieces do keep them from rolling and shifting. With some minor variations in the stretched-out length of the coils, small differences can be obtained in the distances over which the periodic curve is repeated so as to avoid close nesting between adjacent wires, but giving additional contact points, wire to wire, within the same layer.

Calculations for this matrix are as follows:
Plated on copper 50% weight gain on original copper;
Volume on matrix: 1.45 cm$^3$;
Volume of copper: 0.90 cm$^3$;
Percent volume of copper: 62.5%; and
Percent volume of enclosed space: 41%.

EXAMPLE V (Consolidation of Woven Yellow Brass Screen)

Figure 23:
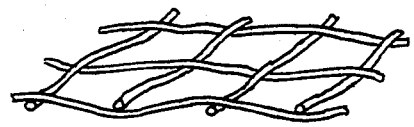
FIG. 23 discloses a woven brass screen employed in conjunction with the teachings of the present invention.

Four pieces of commercial yellow brass woven screening as generally shown in FIG. 23 were chosen. The screening was of approximately 35 mesh, with each piece measuring 50 mm by 20 mm. The pieces were superimposed upon each other, clamped into a form, and treated as follows:

a. electro-cleaned-cathodically with 1.0 ampere for 6 minutes;
b. rinsed, air dried;
c. alkaline copper strike plated with 0.5 ampere for 5 minutes;
d. rinsed
e. acid copper plated cathodically with 0.3 ampere for 1.5 ampere-hour; and
f. rinsed, air dried.

The resultant matrix weighed 3.92 grams and measured 50 mm by 19 mm by 2 mm. The resultant matrix was strong and rigid. The calculated copper deposit was 1.8 grams or 90% of the original screen weight.

Figure 24:
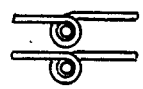
FIG. 24 discloses a pair of twisted wires used in accordance with the teachings of the present invention.

It should be noted that commercial woven screening was used which had a finer mesh than could be hand constructed. Layer to layer joining was obtained. Brass wire base was used although other metal could obviously be incorporated. Metal other than the wire base was deposited. A single layer of woven wire screening can be readily rigidified by the electro-deposition process. As is true with the previous examples, this example has utility to provide increased "green strength" when incorporated into a powder metallurgy compact. In addition to a woven screen, as shown in FIG. 23, a screen having wires twisted around each other as shown in FIG. 24 may be employed.

A developing field of technology is that of primary and secondary or rechargeable storage batteries. Improvement is continuously sought in the ratio of energy charge per unit weight. An essential element in many of these cells involves a supportive metallic grid for a chemically active component. Matrices derived from wire and rigidified by electro-deposition as demonstrated by the above examples can be used beneficially in this area.

For example, a volume of metal in the supportive grid of a matrix according to the present invention, can be as low as 20% of the total volume. This metal serves as an electrical conductor, not as an electro-chemically active energy generating component of the cell. Basic wire can then be chosen for strength, consolidated into a rigid matrix by electro-deposition, and subsequently coated with a metal involved in the chemical action of the battery. Internal resistance of the resulting grid structure can be reduced by suitable combinations of rigidifying metal and final coat. Weight reduction of the structure can be further achieved by, for example, utilization of copper or bronze in combination with a thin lead alloy coat instead of a more massive lead alloy grid structure.

One geometry that is particularly attractive for increasing the percentage of free space in a matrix is the use of a woven screen in layers alternating with a very coarse screen, or just well spaced single wires, all of which are consolidated into a rigidified or single piece of metal. This structure is seen to have usefulness in high current output cells.

EXAMPLE W (Array of Stretched Brass Wire)

Figure 22:
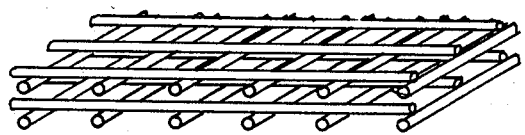
FIG. 22 illustrated an array of stretched brass wires used in accordance with the teachings of the present invention.

Upon a frame with slots at ½ inch intervals around the edges, there was wound No. 28 gage brass wire in five layers. Within each layer the wires passed parallel to one another with each wire crossing at 90° to the wire of an adjacent layer. A general illustration of this configuration is shown in FIG. 22.

To assure pressure of the wires against each other at cross over points a length of 6 mil wire was passed over and under along the 50 mm length of the array and drawn tight. A plating lead of No. 22 gage copper wire was also added.

Electro-deposition was accomplished by first providing electro-cleaning using a solution of 5% trisodium phosphate in a cathodic condition at one ampere, for five minutes. The matrix was rinsed* then subjected to steps c, d, e, and f of Example V above. The final matrix was weighed at 2.52 grams and measured 50 mm by 18 mm by 1.5 mm. The matrix was strong and rigid.

Accordingly, this example shows the flexibility with which an array may be formed that is adoptable to large areas, variable thicknesses, and alternative materials. Soft wire rather than hard wire is an asset in forming the array. The wire of this example is different from copper, that is brass, which is an alloy. Nevertheless, the resultant matrix provides great rigidity and strength.

The adaptation of the basic discovery of this new, novel, useful and versatile conductive body to function reliably and well in a variety of different material environments is assured by the variety of different metal combinations, as to base and plating materials, that can be successfully obtained in chemical deposition processes. Accordingly, while particular examples of the present invention have been shown and described, additional advantages and modifications will readily occur to those skilled in the art. The invention in its broader aspects is, therefore, not limited to the specific details, representative processes, and illustrative examples shown and described. Accordingly, departures may be made from such detail without departing from the spirit or scope of applicant's generally inventive concept, and it is intended that the scope of the invention not be determined by the foregoing examples, but only by the scope of the appended claims.

What I claim is:

1. An electrically conductive body comprising wire crossing wire at multiple sites of mutual contact throughout said body, with said wire interconnected at said sites by a chemical deposition of a metal to yield a rigid, open-wire lattice, and wherein said open-wire lattice is filled with solder to a point of capillary retention.

2. An electrically conductive body comprising wire crossing wire at multiple sites of mutual contact throughout said body, with said wire interconnected at said sites by a chemical deposition of a metal to yield a rigid, open-wire lattice, and wherein said open-wire lattice is filled with solder-coated metallic particles.

3. The body of claim 1 or 2 wherein said wire is interconnected at said sites by an electro-chemical deposition of a metal.

4. The body of claim 1 or 2 wherein said wire is interconnected at said sites by a chemical reduction deposition of a metal.

5. The body of claim 2 or 3 wherein said metal has the same composition as the composition of said wire.

6. The body of claim 1 or 2 wherein said metal has a different composition than the composition of said wire.

7. The body of claim 1 or 2 wherein said lattice is between 20 and 90 percent open volume.

8. The body of claim 1 or 2 wherein the weight of said deposition metal is equal to the weight of said wire.

9. A method of making a conductive body comprising the steps of:
   a. forming an open lattice comprising at least three non-woven layers of wire and having at least a 20% by volume void within the bounds of said lattice;
   b. rigidifying said lattice by chemically depositing a metal upon said lattice to bridge sites of mutual contact of said wire within said lattice; and
   c. infiltrating said lattice with liquid solder and permitting said solder to cool.

10. A method of making a conductive body comprising the steps of:
    a. forming an open lattive comprising at least three non-woven layers of wire and having at least a 20% by volume void within the bounds of said lattice;
    b. rigidifying said lattice by chemically depositing a metal upon said lattice to bridge sites of mutual contact of said wire within said lattice; and
    c. infiltrating said lattice with solder-coated metallic particles and permitting said solder to cool.

11. A method of making a conductive body comprising the steps of:
    a. forming an open lattice of wire having at least a 20% by volume void within the balance of said lattice, and wherein said step of forming includes obtaining a form which outlines a desired shape of said lattice and loading said form with randomly oriented lengths of wire which lengths of wire are sufficiently short to leave at least a 20% by volume void within said form; and
    b. rigidifying said lattice by chemically depositing a metal upon said lattice to bridge sites of mutual contact of said wire within said lattice.

12. The method of claim 8 wherein said shape has a linear configuration to result in a body forming a linear conductor.

13. The method of claim 8 wherein said shape has a planar configuration to result in a body forming a flat sheet conductor.

14. The method of claim 8 further including the step of securing said lattice in situ in said form by an insulated adhesive or plastic.

15. The method of claim 8 further including the step of securing a metal plate to one surface of said lattice during said step of chemically depositing by first using said plate as a supporting surface of said form.

16. The method of claim 8 wherein said step of chemically depositing includes depositing said metal by electro-chemical deposition.

17. The method of claim 8 wherein said step of chemically depositing includes depositing said metal by chemical reduction deposition.

18. The method of claim 8 further including the step of infiltrating said lattice with liquid solder and permitting said solder to cool.

19. The method of claim 8 further including the step of infiltrating said lattice with solder coated metallic particles and permitting said solder to cool.

20. The method of claim 8 wherein said depositing continues until the weight of said metal equals the weight of said wire.

21. The method of claim 8 further including the step of chemically depositing a second metal upon said lattice.

* * * * *